United States Patent [19]
Stubbe et al.

[11] Patent Number: 5,631,603
[45] Date of Patent: May 20, 1997

[54] OFFSET CANCELLATION FOR DIFFERENTIAL AMPLIFIERS

[75] Inventors: Frederic M. Stubbe, Irvine; Edward W. MacRobbie, Lake Forest; Daryush Shamlou, Laguna Niguel, all of Calif.

[73] Assignee: Rockwell International Corporation, Seal Beach, Calif.

[21] Appl. No.: 536,331

[22] Filed: Sep. 29, 1995

[51] Int. Cl.⁶ ..................................................... H03F 3/45
[52] U.S. Cl. .............................................. 330/9; 330/258
[58] Field of Search .................................. 330/9, 253, 258, 330/261

[56] References Cited

U.S. PATENT DOCUMENTS 4,806,875  2/1989  Schaffer ........................ 330/9
5,124,663  6/1992  McEntarfer et al. ............ 330/9

*Primary Examiner*—Steven Mottola
*Attorney, Agent, or Firm*—George A. Montanye; Philip K. Yu

[57] ABSTRACT

A differential amplifier with improved offset cancellation is disclosed. The differential amplifier has a floating current source coupled to the drain terminals of the differential pair for providing complementary currents to cancel the offset voltage. In this way, the tail current in the differential pair is not affected by the offset cancellation and remains constant, while the common-mode offset is not worsened by the injected current.

12 Claims, 3 Drawing Sheets

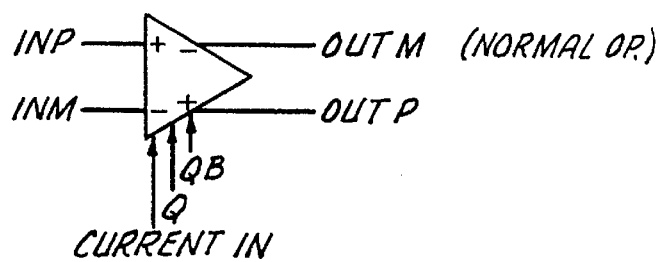
_Fig. 1._
(PRIOR ART)
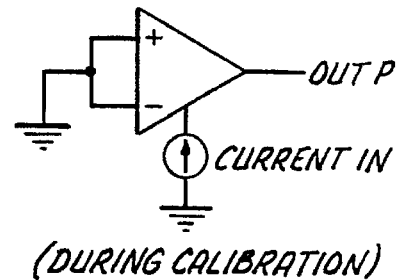
_Fig. 2._
(PRIOR ART)
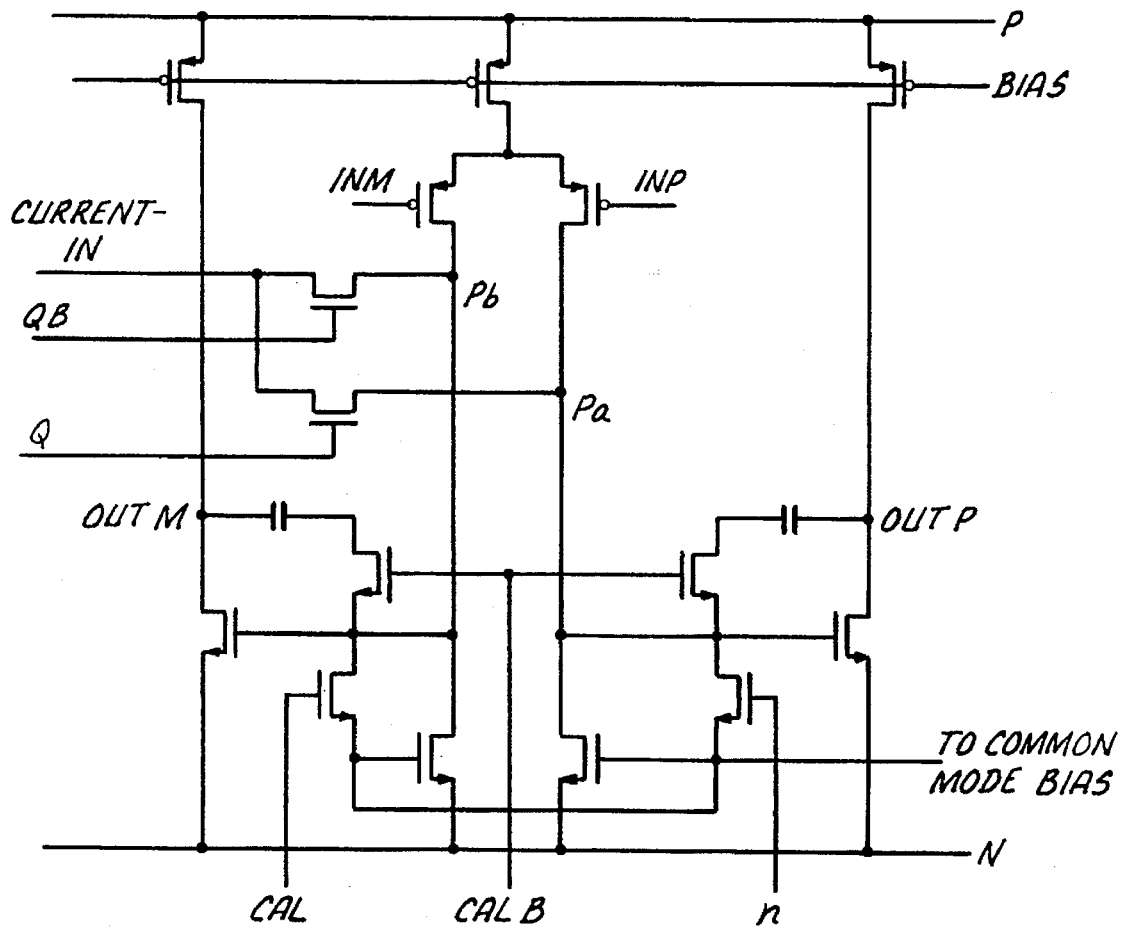
_Fig. 3._
(PRIOR ART)

OFFSET CANCELLATION FOR DIFFERENTIAL AMPLIFIERS

FIELD OF THE INVENTION

The present invention relates to amplifier circuits and more particularly to fully differential amplifier circuits with differential offset.

ART BACKGROUND

It is quite common to use fully differential amplifiers in the analog front end of signal buffers or filters such as those in audio applications, where high dynamic range is desired. With a higher dynamic range, the signal-to-noise ratio is increased. FIG. 1 shows a conventional fully differential amplifier in its normal operation mode, while FIG. 2 shows the same differential amplifier undergoing an initial calibration process. It will be appreciated by those skilled in the art that calibration is needed for these amplifiers due to the differential offset voltage from the differential pair transistors, which reduces the effective dynamic range of the circuit. The goal for calibration is therefore to determine the current needed to effectuate offset cancellation.

Reference is to FIG. 2. During the calibration cycles, the amplifier is converted into a single-ended comparator by having both inputs of the amplifiers grounded to analog ground ("AGND") and using switches to make the amplifier open-loop and single-ended. The positive output ("OUTP") will sit at the positive or negative supply rail, while a current is injected through Current-In. As more and more Current-In is applied to the amplifier, the voltage level of the output OUTP will flip sooner or later to the other supply rail and therefore cross AGND. Note that for analog applications, the AGND is typically half-way between the positive and negative supply rails. At this time, the current needed to cancel the differential offset voltage is determined. After calibration, the normal operation resumes as in the configuration of FIG. 1 with the now-determined Current-In consistently applied to cancel the differential offset of the amplifier.

Referring to FIG. 3, where a schematic diagram of the conventional differential amplifier of FIG. 2 is shown. Again, during calibration cycles, i.e. CAL is active, with both inputs INP and INM grounded to AGND, Current-In is supplying current to either branch pa or pb, depending upon whether Q or QB is active. (Note: Q and QB are complementary signals.) If Q is active, current is injected to the branch pa to ramp down the output voltage OUTP until OUTP's level crosses AGND. When AGND is crossed by the output OUTP, the current applied to branch pa is thus the requisite current to cancel the offset voltage of the differential pair.

If, however, the maximum current is reached and the output OUTP never crossed AGND, it indicates that the offset voltage has another polarity, e.g. offset <0. In this case, QB turns high and begins injecting current into branch pb to cause the voltage level of OUTP to ramp up and to cross AGND. This will determine the current, albeit in another direction, necessary to cancel the offset voltage of the input differential pair.

As described, the conventional approach to offset cancellation has been to reduce the differential offset by injecting a current, I, in one of the two branches of the differential input pair. For fully differential amplifiers, this approach has resulted in a common-mode offset in that the differential offset is now, effectively, shifted by the injected current to the common-mode circuitry of the differential amplifier. Referring to FIG. 3, the total current out of branches pa and pb is now greater than the current out of the current source CS due to the injected current from Current-In. To compensate for the difference, the common-mode circuitry (not shown) needs to generate an offset voltage, which will then adversely affect the dynamic range of the amplifier.

Therefore, it is desirable to have a differential amplifier with offset cancellation of the differential signal without affecting the offset of the common-mode circuitry.

It is also desirable to achieve offset cancellation without increasing complexity of the circuit.

SUMMARY OF THE INVENTION

A differential amplifier with improved offset cancellation is disclosed. In this approach, the differential amplifier is converted to a single-ended comparator and the differential offset is reduced by injecting a current, Iin one branch and extracting the same current, Iout of the other branch, without affecting the offset of the common-mode circuitry.

The differential amplifier has a current source connected to a positive supply for providing current through the differential amplifier. Also, a differential pair in common source configuration is coupled to the current source with the common source being coupled to the current source. The differential pair is also coupled to an active load at their drain terminals and has a current source coupled to both the drain terminals of the differential pair for providing complementary currents, which are currents of the same amplitude but in opposite direction, to cancel the offset voltage. This way, the common-mode offset of the circuit is not affected by the injection.

BRIEF DESCRIPTION OF THE DRAWINGS

Additional objects, features and advantages of the present invention will become apparent to those skilled in the art from the following detailed description, wherein:

FIG. 1 shows a conventional fully differential amplifier in its normal operation mode.

FIG. 2 shows the same differential amplifier undergoing an initial calibration process.

FIG. 3 shows a schematic diagram of the conventional differential amplifier of FIG. 2.

DETAILED DESCRIPTION OF THE PREFERRED EMBODIMENT

Figure 4A:
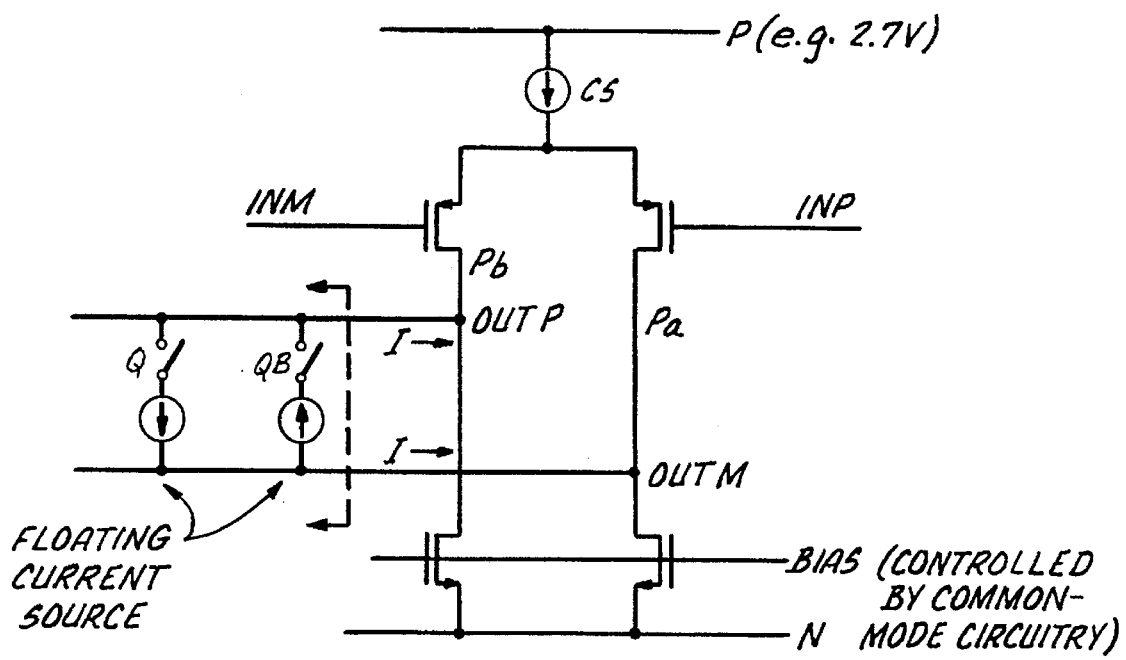
FIG. 4(a) shows a simplified schematic diagram of the improved offset cancellation amplifier in accordance with the present invention.

Reference is to FIG. 4(a), where a simplified schematic diagram of the improved offset cancellation amplifier in accordance with the present invention is shown. A current source ("CS") is coupled to the sources of a differential pair of transistors. The gates of the transistors are coupled to the differential input signals INP, INM. An active load is coupled to the sources of the differential pair and controlled by common-mode circuitry (not shown) through the signal BIAS. Note that the supply rails P and N are typically 2.7 v and 0 v, respectively, for low-power applications. The outputs OUTP, OUTM appear at the drains of the differential pair of transistors. A floating current source, i.e. a current source with neither of its two terminals connected to a supply rail voltage, is coupled between the output nodes of OUTM and OUTP for branches pa and pb, respectively. Note that the floating current source injects current into the differential pair and extract the same from the differential pair.

Referring to FIG. 4(a), note that either Q or QB is switched on to allow current, I, be injected into branches pa or pb, and extracted from branches pb or pa, respectively. When Q is closed, a current, I, is injected into branch pa, while a current of the same magnitude is extracted from branch pb back to the current source. Similarly, when QB is dosed, a current, I, is injected into branch pb, while the same is extracted from branch pa. Note that once the current, either through Q or QB, necessary to achieve offset cancellation is determined during calibration, the same current is consistently applied during normal operation. The net effect of this is that the total current into the differential pair has not changed and no shifting to the common-mode circuitry can take place to worsen the undesirable common-mode offset.

Figure 4B:
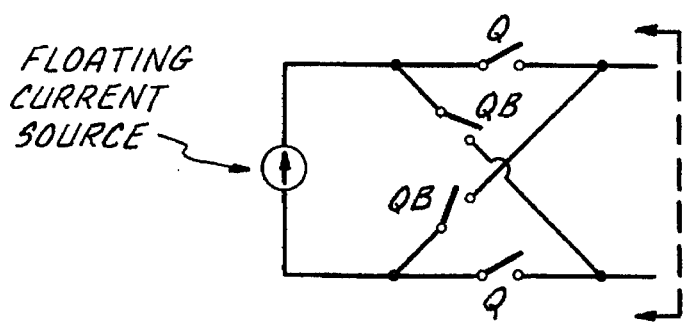
FIG. 4(b) shows another embodiment of the current source to be used in connection with the present invention.

FIG. 4(b) shows another embodiment of the current source configuration for offset cancellation. Note that only one floating current source is used here.

Figure 5:
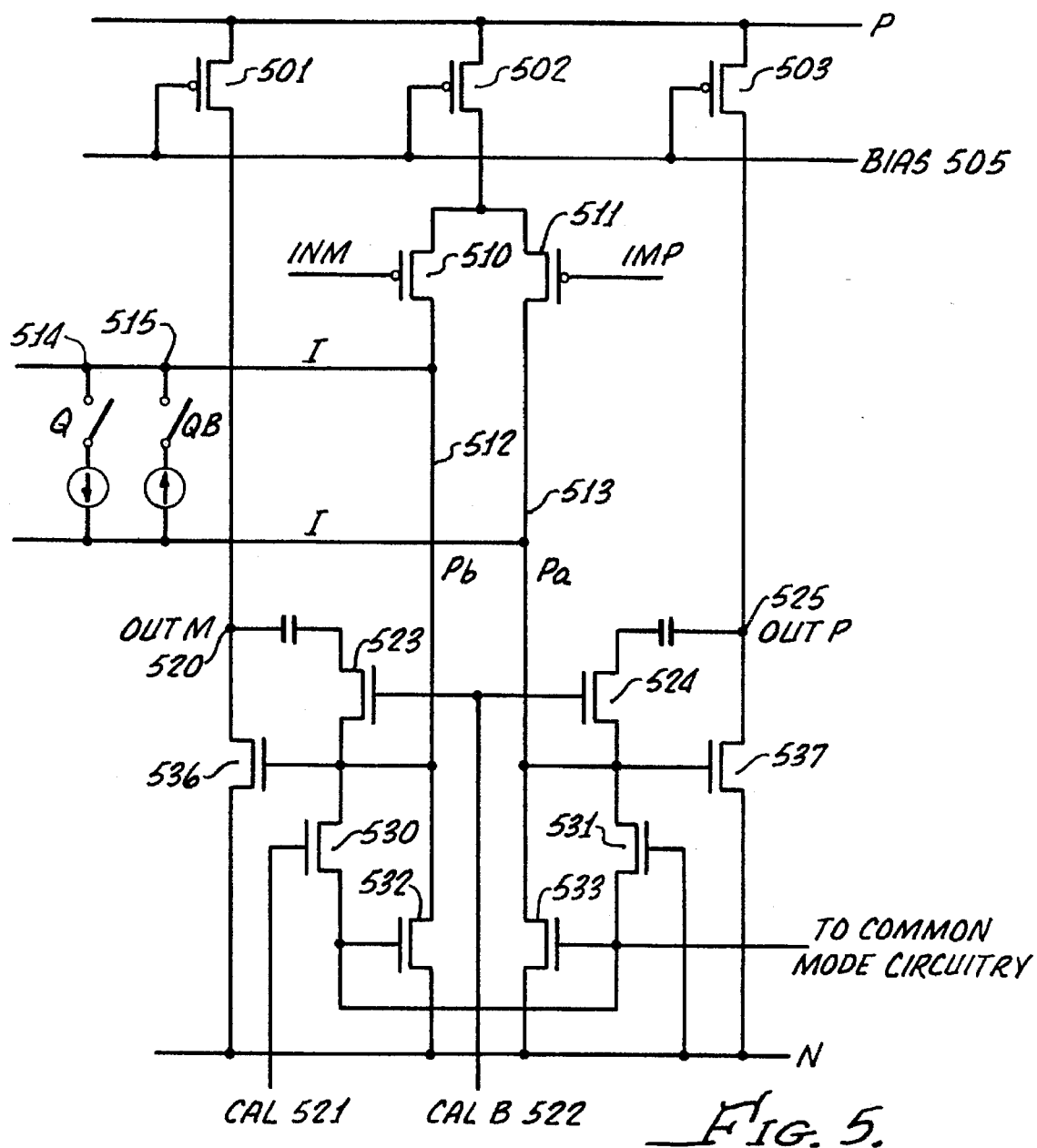
FIG. 5 shows a schematic diagram of the differential amplifier with improved offset cancellation in accordance with the present invention.

FIG. 5 shows a schematic diagram of the differential amplifier with improved offset cancellation in accordance with the present invention. The transistors 501, 502, 503 are PMOS devices acting as a current source. Their gates are coupled to a BIAS voltage 505 generated from a separate BIAS circuit (not shown)The differential pair 510, 511 are also PMOS devices with their sources coupled to the drains of the PMOS 502. The input signals INM and INP are applied to the gates of the differential pair 510, 511, respectively. Coupled to the drains of the differential pair 510, 511 at branch pa and pb are the drains of load transistors 532, 533. One of the output signals, OUTM 520, appears at the node connecting the drain of PMOS 501, the drain of NMOS 523, and the drain of NMOS 536. Similarly, the other output, OUTP 525, appears at the node connecting the drain of PMOS 503, the drain of NMOS 524 and the drain of NMOS 537.

During calibration, a calibration signal CAL 521 is applied to the gate of NMOS 530, which has its source connected to the source of NMOS 531 and the gate of NMOS 532. The complementary calibration CALB 522 is applied to the gates of NMOS transistors 523, 524. Note that the gate of NMOS 533 and the source of NMOS 531 are also coupled to common-mode circuitry (not shown), as will be understood by those skilled in the art.

The floating current sources 514, 515 are connected between the branches pa and pb 513, 512, respectively, as previously described in connection with FIG. 2, to apply a current of I.

When the signal CAL goes high, the calibration process begins with the signal Q going high to connect the current source 514. This will cause the output OUTP to gradually ramp down, until it flips to the other supply rail, thus crossing AGND. The current from current source 514 is therefore the current needed to cancel the offset voltage.

However, if the offset has the other polarity, then the maximum current will be reached without the output voltage level ever crossing AGND, since the output will reach and stay at the bottom rail. In this case, the other current source 515 will be connected by QB going high. Then the output voltage level OUTP will be ramped up to eventually cross AGND. The current from the current source 515 at this moment is therefore what is needed to cancel the offset.

Figure 6:
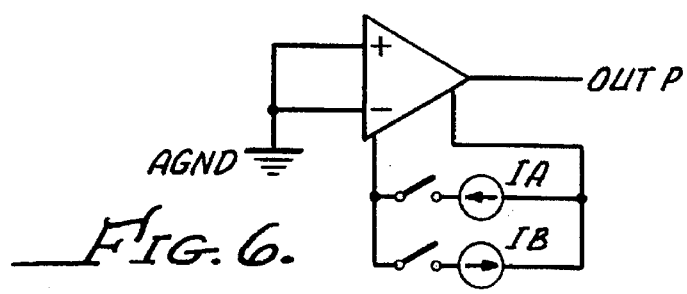
FIG. 6 shows a symbolic representation of the improved differential amplifier with offset cancellation in calibration mode.

FIG. 6 shows a symbolic representation of the differential amplifier with improved offset cancellation during calibration mode. As previously described, the two inputs are tied to AGND, while the output OUTP is checked for an AGND crossing to determine the current needed to cancel the output voltage offset.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A differential amplifier with offset cancellation, said differential amplifier having a predetermined output voltage offset, comprising:

first current source means connected to a positive supply for providing current through said differential amplifier;

a differential pair comprising source, drain and gate terminals in common source configuration, said common source being coupled to said first current source means;

active load means connected to said drain terminals of said differential pair, and second current source means coupled to both of said drain terminals of said differential pair for injecting and extracting complementary currents to said drain terminals, respectively to cancel said predetermined offset voltage.

2. A differential amplifier according to claim 1, wherein said second current source means comprises either one of at least one floating current source or at least two fixed current source with complementary currents.

3. A differential amplifier according to claim 2, wherein: said differential pair comprises a pair of PMOS transistors.

4. A differential amplifier according to claim 2, wherein: said differential pair comprises a pair of NMOS transistors.

5. A differential amplifier according to claim 1, wherein said second current source means comprises first and second current sources for injecting currents into said differential pair to cancel said predetermined offset voltage.

6. A differential amplifier according to claim 2, wherein said floating current source means comprises first and second current sources for injecting currents into, and extracting currents out of, said differential pair to cancel said predetermined offset voltage.

7. A differential amplifier according to claim 3, wherein said floating current source means comprises first and second current sources for injecting currents into, and extracting currents out of, said differential pair to cancel said predetermined offset voltage.

8. A differential amplifier according to claim 4, wherein said floating current source means comprises first and second current sources for injecting currents into, and extracting currents out of, said differential pair to cancel said predetermined offset voltage.

9. A differential amplifier with offset cancellation, said differential having a predetermined offset voltage, comprising:

current source means coupled to a positive supply for providing current through said differential amplifier;

a differential pair having source, gate and drain terminals in common source configuration, their common source terminals being coupled to said current source means;

active load means coupled to the drain terminals of said differential pair;

first current source means coupled to one drain terminal of said differential pair for applying a first current to said differential pair, and second current source, equal in magnitude to, but opposite in direction to, said first current source means, coupled to another drain terminal of said differential pair for applying a second current to said differential amplifier, wherein both said first and second currents applied together cancel said predetermined offset voltage.

10. A differential amplifier according to claim 9, wherein: said differential pair comprises a pair of PMOS transistors.

11. A differential amplifier according to claim 9, wherein: said differential pair comprises a pair of NMOS transistors.

12. A method of canceling a predetermined offset voltage in a differential amplifier, said differential amplifier comprising a first current source connected to a positive supply for providing current through said differential amplifier, the method comprising the steps of:

(a) connecting a differential pair comprising source, drain and gate terminals in common source configuration, said common source being coupled to said second current source means;

(b) connecting an active load to said drain terminals of said differential pair, and (c) connecting a second current source to said drain terminals of said differential pair for providing complementary currents to said drain terminals to cancel said predetermined offset voltage, said second current source applying a predetermined current to one drain terminal of said differential pair while extracting a complementary current of said predetermined current from another drain terminal.

* * * * *